(12) United States Patent
Acharya

(10) Patent No.: US 7,412,471 B2
(45) Date of Patent: Aug. 12, 2008

(54) DISCRETE FILTER HAVING A TAP SELECTION CIRCUIT

(75) Inventor: Tinku Acharya, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 11/488,566

(22) Filed: Jul. 18, 2006

(65) Prior Publication Data

US 2006/0259532 A1 Nov. 16, 2006

Related U.S. Application Data

(62) Division of application No. 09/432,337, filed on Nov. 2, 1999, now Pat. No. 7,080,108.

(51) Int. Cl.
*G06F 17/10* (2006.01)

(52) U.S. Cl. .................................. 708/319; 708/316
(58) Field of Classification Search ................. 708/319
See application file for complete search history.

(56) References Cited

U.S. PATENT DOCUMENTS

| | | | | | |
|---|---|---|---|---|---|
| 4,817,025 | A | * | 3/1989 | Asai et al. | 708/301 |
| 5,050,119 | A | * | 9/1991 | Lish | 708/319 |
| 5,224,123 | A | * | 6/1993 | Iga et al. | 375/232 |
| 5,285,475 | A | * | 2/1994 | Kurokami | 375/233 |
| 5,648,923 | A | * | 7/1997 | Lane et al. | 708/316 |
| 6,377,968 | B1 | * | 4/2002 | Nakase et al. | 708/319 |

* cited by examiner

*Primary Examiner*—Tan V Mai
(74) *Attorney, Agent, or Firm*—Trop, Pruner & Hu, P.C.

(57) ABSTRACT

A digital signal processing circuit includes a chain of processing units having a selectable number of taps and a tap selection circuit. The tap selection circuit is coupled to the chain of processing units to establish the number of taps of the chains.

17 Claims, 4 Drawing Sheets

DISCRETE FILTER HAVING A TAP SELECTION CIRCUIT

This application is a divisional of U.S. patent application Ser. No. 09/432,337, entitled "Discrete Filter Having A Tap Selection Circuit," filed on Nov. 2, 1999, now U.S. Pat. No. 7,080,108.

BACKGROUND

The invention generally relates to a discrete filter.

Electronic filters may be used in a wide range of applications. As examples, filters may be used in digital imaging applications to filter out noise, and filters may be used in wireless communication applications to reduce inter-symbol interference and aliasing effects. One general type of filter is a discrete, or digital filter, that may form the basis of most digital signal processing (DSP) operations.

The digital filter may be a finite impulse response (FIR) filter, a filter in which the impulse response of the filter is zero outside of a predefined interval; or an infinite impulse response filter (IIR), a filter in which the impulse response of the filter does not fall to zero outside of a predefined interval. As an example, the FIR filter receives indications of sampled values (called x( )) of an input signal to produce digitized values (called y(i)) of the filtered output signal, as described by the following equation:

$$y(i) = \sum_{j=-N}^{N} C(j) \cdot x(i+j) = \text{Eq. (1)}$$

$$C(0) \cdot x(i) + \sum_{i=1}^{N} \{C(j) \cdot x(i+j) + C(-j) \cdot x(i-j)\},$$

where "C(j)" represents a particular filter coefficient and "j" denotes the index value used in the summation. The number of coefficients (2N+1) in Eq. 1 equals the number of taps of the filter. The filter may be further classified as being symmetric or asymmetric. For a symmetric filter, the C(j) coefficients are symmetric about j=0. Thus, C(−n)=C(n) for a symmetric filter. Otherwise, the filter is asymmetric.

A conventional filter may use a general purpose DSP processor to perform the summation described by Eq. 1 to derive each y(i) value. In this manner, the DSP processor may include a multiplier-accumulator (MAC) unit that uses a multiple number of processing clock cycles (one for each multiplication, for example) to derive each y(i) value. Unfortunately, the processing time of this arrangement may be too long for some applications. Alternatively, an arrangement called a tapped delay line may be used to produce the y(i) values. The tapped delay line includes serially coupled processing stages, and each processing stage is associated with one of the C(j) coefficients. Unfortunately, a conventional tapped delay line is specifically designed for a specific number of taps, a feature that limits the number of filter designs that may use this delay line. Furthermore, due to its size, the tapped delay line may occupy a large semiconductor area and may consume a considerable amount of power.

Thus, there is a continuing need for an arrangement that addresses one or more of the problems that are stated above.

SUMMARY

In one embodiment of the invention, a digital signal processing circuit includes a processing chain that has a selectable number of taps and a tap selection circuit. The tap selection circuit is coupled to the processing chain to establish the number of taps of the chain.

Advantages and other features of the invention will become apparent from the following description, drawing and claims.

DETAILED DESCRIPTION

Figure 1:
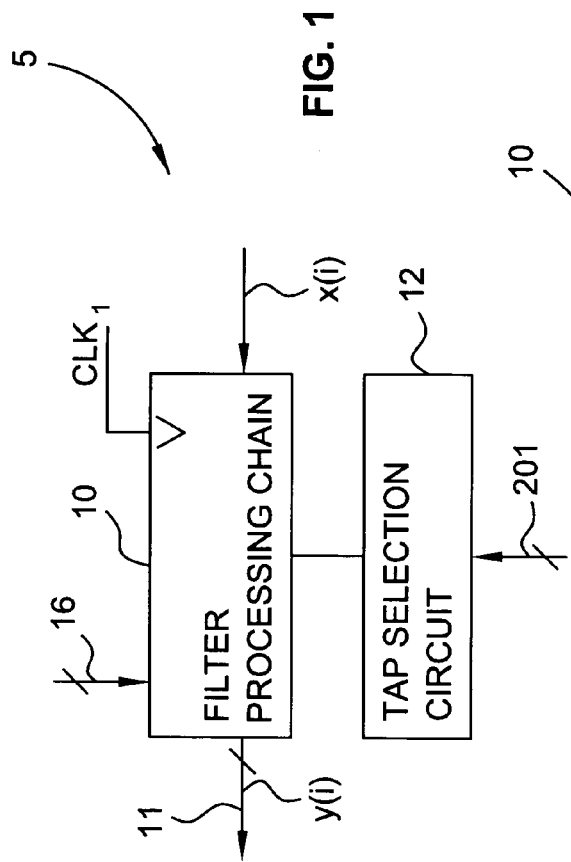
FIG. 1 is a schematic diagram of a digital filter system according to an embodiment of the invention.

Referring to FIG. 1, an embodiment 5 of a digital filter system in accordance with the invention includes a systolic processing chain 10 that has a selectable number of taps. Due to this architecture, the system 5 may be used to form a wide range of digital filters, as the number of taps may be selected by a programmable tap selection circuit 12 that is coupled to the processing chain 10. As further described below, output terminals 11 of the processing chain 10 may indicate a filtered output value (called y(i)) on each cycle of a clock signal (called $CLK_1$), a feature that results in 100% throughput for the processing chain 10.

As an example, in some embodiments, the digital filter system 5 may be used to implement a symmetric finite impulse response (FIR) filter. Due to the symmetry (C(n)=C(−n)) of the filter coefficients for this type of filter, Eq. 1 may be simplified, as described by the following equation:

$$y(i) = C(0) \cdot x(i) + \sum_{i=1}^{N} C(j) \cdot (x(i-j) + x(i+j)) \quad \text{Eq. (2)}$$

In Eq. 2, each "x( )" denotes a particular input value, "C( )" represents a particular filter coefficient and "y(i)" represents a particular filter output. It may be noted from Eq. 2 that although the number of taps of the filter is 2N+1, the number of filter coefficients (i.e., C(0), C(1), C(2), . . . C(N)) that are used by the filter is equal to N+1. Thus, except for the C(0) filter coefficient (that is associated with one tap of the filter), each C(j) filter coefficient is associated with two taps of the filter due to the symmetry. For example, N equals three for a seven tap filter, and as an example, a particular output value y(10) for the seven tap filter may be described by the following equation:

y(10)=C(3)·{x(9)+x(13)}+C(2)·{x(8)+x(12)}+
    C(1)·{x(9)+x(11)}+C(0)·x(10)   Eq. (3)

Figure 2:
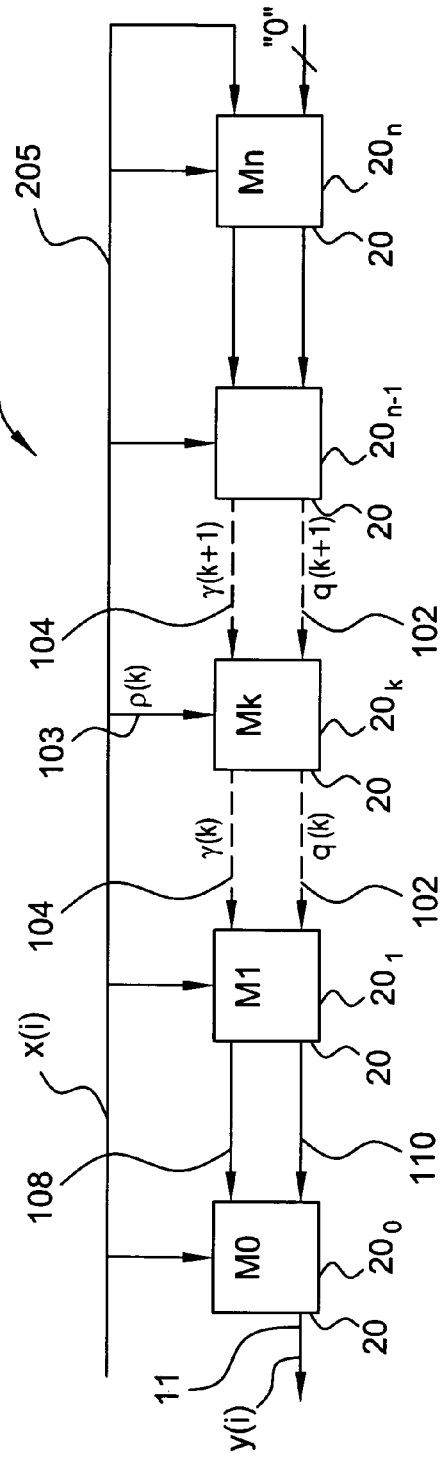
FIG. 2 is a schematic diagram of the processing chain of FIG. 1 according to an embodiment of the invention.

Thus, except for the C(0) coefficient, each C(j) coefficient is multiplied by a pair of input values (i.e., x(i−j)+x(i+j)). Referring to FIG. 2, in some embodiments, these multiplications may be performed by N+1 processing units 20 (processing units $20_0, 20_1, \ldots, 20_k, \ldots 20_{n-1}, 20_n$, as examples) of the chain 10, each of which exploits the symmetric property of the filter by multiplying a different C(j) coefficient by the appropriate pair of input values. As further described below, the processing units 20 form a systolic architecture, an architecture in which all of the processing units 20 are producing products on each clock cycle of the $CLK_1$ signal so that the chain 10 produces a different output value on each clock cycle.

More particularly, the processing units 20 are serially coupled together to form a serial chain for forming the output values, a chain in which the processing occurs from the processing unit $20_n$ to the processing unit $20_0$. Each processing unit 20 is associated with a different filter coefficient (i.e., each processing unit 20 is associated with two taps of the filter) and generates a corresponding product for each output value. In this manner, each processing unit 20 receives an indication (via accumulation input lines 102) of an ongoing sum from the predecessor processing unit 20 (except for the first processing unit $20n$) in the chain 10, updates the ongoing sum with an additional product and furnishes an indication of the ongoing sum (via accumulation output lines 110) to the successor processing unit 20 (except for the last processing unit $20_0$) in the chain 10.

Figure 3:
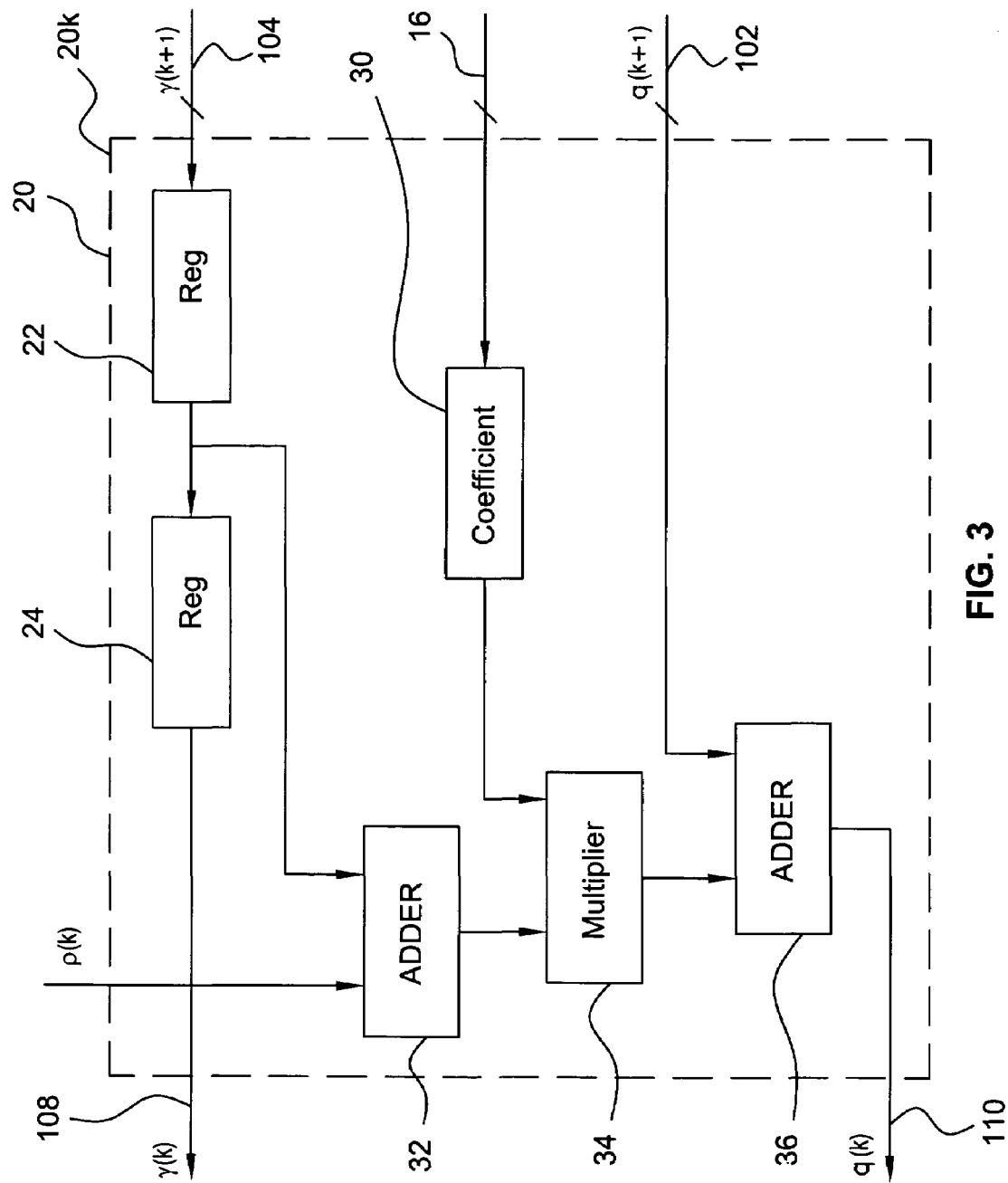
FIG. 3 is a schematic diagram of a processing unit of the chain of FIG. 2 according to an embodiment of the invention.

Referring to FIG. 3, as an example, a particular processing unit $20k$ receives three input signals that indicate three respective values: p(k), the broadcast input value (from a broadcast input line 205) that is equivalent to some x value; r (k+1), a delayed input value indicated by the predecessor processing unit $20k+1$ (not shown) in the chain 10; and q(k+1), an ongoing sum value indicated by the predecessor processing unit $20k+1$ in the chain 10. The processing unit $20k$ furnishes two output signals (to the successor processor unit $20k-1$ (not shown)) that indicate two respective values: r(k) and q(k). Mathematically, r(k) and q(k) may be described by the following equations:

$$r(k)=r(k+1) \quad \text{Eq. (4)}$$

$$q(k)=q(k+1)+C(x)\cdot\{p(k)+r(k+1)\} \quad \text{Eq. (5)}$$

Based on the above-described principle of operation, it may be observed that r(k+1)=x(i−j) when p(k)=x(i+j), and thus, for these input values, q(k)=C(j)·[x(i+j)+x(i−j)].

Referring back to FIG. 2, as an example, in some embodiments, the processing units $20_0, 20_1, \ldots, 20_k, \ldots 20_{n-1}, 20_n$ are associated with the C(n), C(n−1), ... C(k), ... C(1), C(0) coefficients, respectively, and the processing chain 10 begins with processing unit $20_n$ and ends with the processing unit $20_0$. Thus, as an example, for a particular output value, the processing unit $20n$ provides the first product (called the C(0) product) by multiplying the x(i) value by C(0). It is noted that for j=0, x(i+j)=x(i−j)=x(i). The product that is provided by the processing unit $20n$ begins a sum to which all the processing units 20 contribute another product. In this manner, the processing unit $20n-1$ receives signals from the processing unit 20 that indicate the C(0)·x(i) product. The processing unit $20n-1$ adds the term C(1)·[x(i+1)+x(i−1)], called the C(1) product, to the ongoing sum and furnishes signals to the next processing unit in the chain, etc. Eventually, the processing unit $20_0$ adds the last product (the C(N)·[(x+N)+(x−N)] product) to the rolling sum to generate the signal at the output terminals 11. It is noted that when the processing chain 10 receives x(0) to begin the filtering, N+1 clock cycles are consumed to produce the first valid output value. However, thereafter, the processing chain 10 produces an output on every clock cycle, thereby resulting in 100% throughput.

Referring back to FIG. 3, as an example, in some embodiments, the processing unit $20k$ may include input 22 and output 24 registers that delay the digital signal that indicates each r(k+1) value before communicating the signal to the successor processing unit $20k-1$. In this manner, in some embodiments, the input register 22 receives the digital signal that indicates the r(k) signal (via the input lines 104) on a positive edge (for example) of a processing clock signal (called $CLK_1$) and communicates the stored digital signal to the output register 24 on the next positive edge (as an example) of the $CLK_1$ signal. The output register 24 indicates (via the output lines 108) the stored digital signal (i.e., indicates the r(k) value) to the successor input register 22 in the processing chain 10.

The processing unit $20k$ also includes an adder 32, a multiplier 34 and an adder 36 to generate the q(k) value. In some embodiments, these components are clocked by a clock signal (called $CLK_2$) that is synchronized to the $CLK_1$ clock signal and has a frequency that is a multiple of the frequency of the $CLK_1$ clock signal so that the q(k) signal is generated on each positive edge (for example) of the $CLK_1$ signal. In this manner, the adder 32 is coupled to receive the digital signal that indicates the r(k+1) value synchronously with the reception of the r(k+1) value by the input register 22. The adder 32 adds this digital signal with a digital signal that indicates the current p(k) value to form an indication of p(k)+r(k+1). The multiplier 34 multiplies the digital output signal from the adder 32 with a digital signal that indicates the associated filter coefficient to produce the digital signal that indicates the C(k)·[p(k)+r(k+1)] signal. The digital signal that indicates the filter coefficient is stored in a coefficient register 30. The coefficient may be changed via data and control lines 16 that are coupled to the register 30. The adder 36 combines the digital output signal from the multiplier 34 with the q(k+1) signal to produce the digital output signal (on the output lines 110) that indicates the q(k) value.

Figure 4:
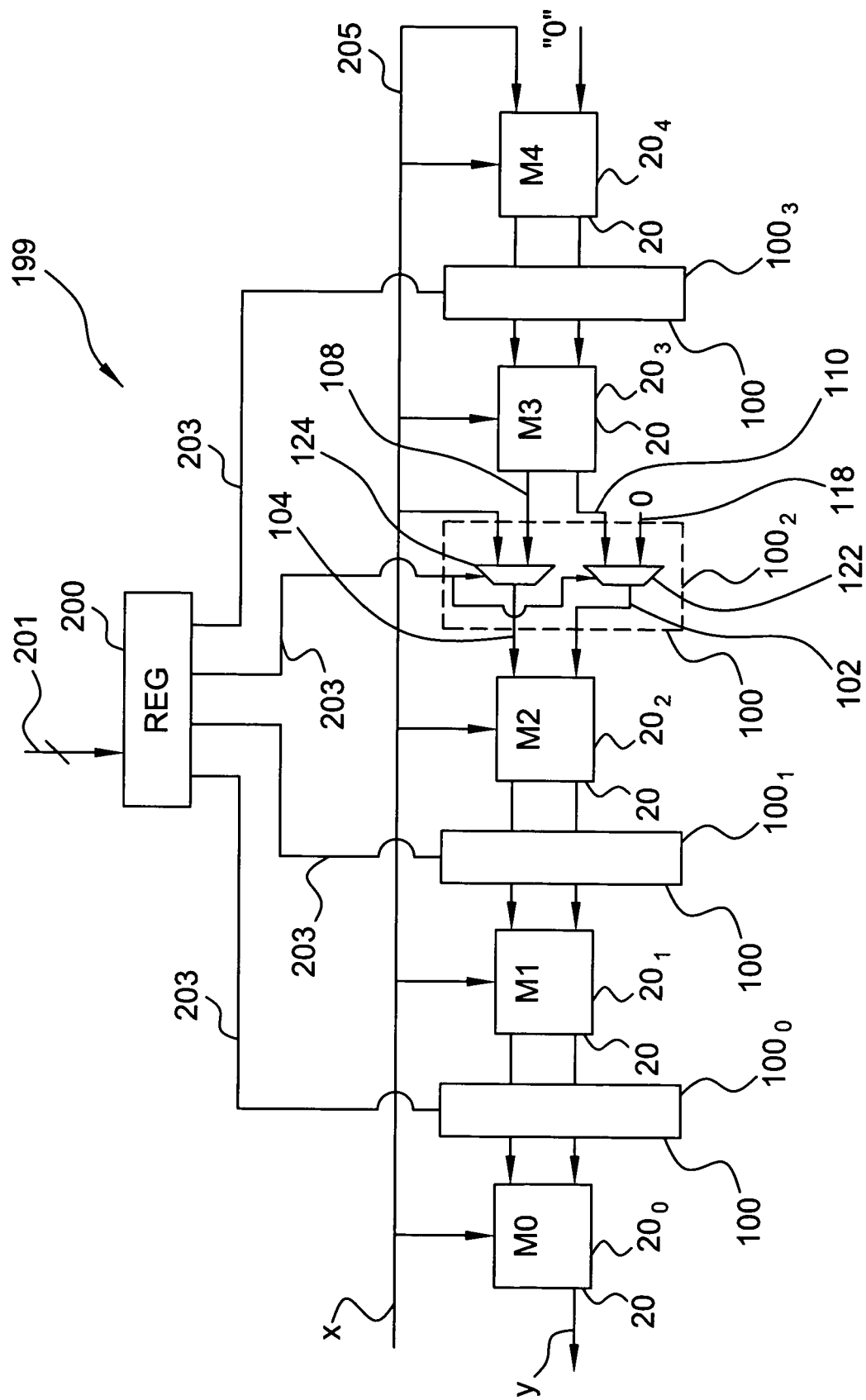
FIG. 4 is a more detailed schematic diagram of the digital filter system of FIG. 1 according to an embodiment of the invention.

FIG. 4 depicts an example of the integration of the processing chain 10 and the tap selecting circuit 12 to form a selectable tap filter 199 that permits the selection of up to seven taps. In this manner, the filter 199 includes a processing chain of five processing units $20_0, 20_1, 20_2, 20_3$ and $20_4$. The filter 199 also includes four termination units $100_0, 100_1, 100_2$, and $100_3$ (of the same design 100) that are associated with the processing units $20_0, 20_1, 20_2$, and $20_3$, respectively. In this manner, a particular termination unit 100 may be selected (via the appropriate bit in a register 200) to terminate the processing chain at its associated processing unit 20. For example, the termination unit $100_2$ may be selected to terminate the processing chain at the processing unit $20_2$ and thus, create a five tap processing chain. Similarly, the termination unit $100_1$ may be selected to terminate the processing chain at the processing unit $20_1$ and thus, create a three tap processing chain.

The selection of a particular termination unit 100 may be accomplished via selection lines 103, each of which extends to a different termination unit 100. In this manner, when a particular selection line 103 is asserted (driven high, for example) the associated termination unit 100 is selected and thus, the number of taps is selected. It is noted that only one selection line 103 is asserted, and the remaining selection lines 103 are deasserted (driven low, for example). The selection lines 103 may indicate respective selection bits of a selection register 200, and the selection bits may be stored in the register 200 via data and control lines 201.

As depicted by the termination unit $100_2$, each termination unit 100 may include a multiplexer 124 that selects either the broadcast input lines 205 (when the termination unit 100 is selected) or the output lines 108 (when the termination unit 100 is deselected) of the predecessor processing unit 20 and couples the selected lines to the input lines 104. The termination unit 100 may also include another multiplexer 122 that selects either the output lines 110 (when the termination unit 100 is selected) of the previous processing unit 20 or the lines 118 (when the termination unit 100 is deselected) indicative of "0" (i.e., a zero sum) and couples the selected lines to the input lines 102.

Figure 5:
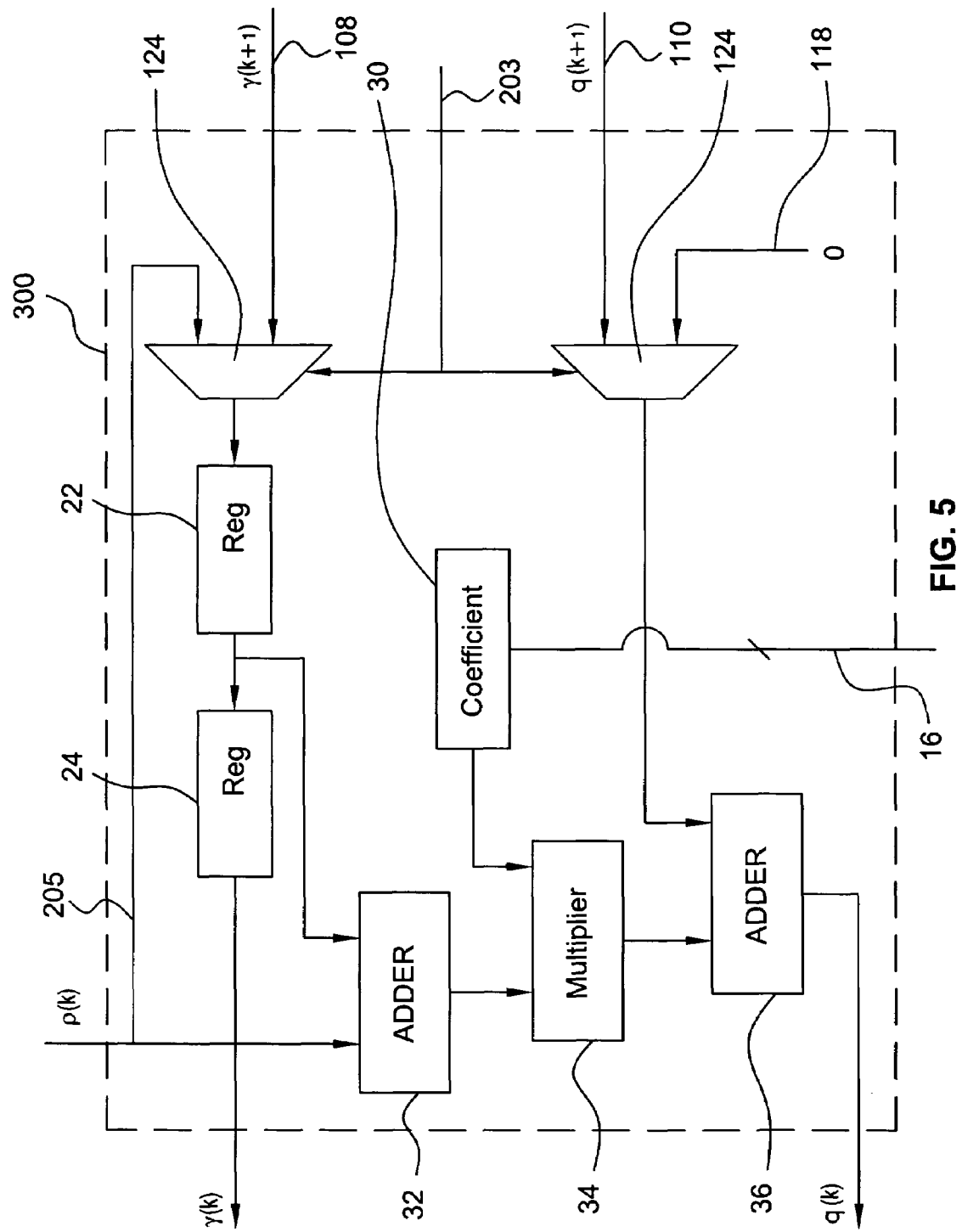
FIG. 5 is a schematic diagram of a unit that may be replicated to form a processing chain according to another embodiment of the invention.

Referring to FIG. 5, in some embodiments, the processing unit and termination unit may be combined to form a combined unit 300. In this manner, the unit 300 may be replicated to form a processing chain of an arbitrary length. This processing chain may be effectively truncated as needed to suit a particular filtering application, as described above.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A digital signal processing circuit comprising:
    a processing chain having a selectable number of taps and progressively accumulating a sum along the taps, the processing chain comprising a serial chain of processing units and each of the processing units having a different gain; and
    a tap selection circuit coupled to the processing chain to selectively establish the number of taps of the chain, the tap selection circuit comprising a multiplexer to select one of the taps as the beginning tap in the chain and set an accumulated sum at the selected tap to zero.

2. The processing circuit of claim 1, wherein the tap selection circuit comprises:
    a register storing bits indicative of the number of taps.

3. The processing circuit of claim 1, wherein the processing circuit comprises a finite impulse response filter.

4. The processing circuit of claim 1, wherein the processing circuit comprises an infinite impulse response filter.

5. A method comprising:
    providing a processing chain line having a fixed number of taps;
    disabling some of the taps of the chain comprising selecting one of the taps as the beginning tap in the delay line and setting an accumulated sum at the selected tap to zero; and
    using the remaining taps to establish a finite impulse response filter.

6. The method of claim 5, further comprising:
    storing bits indicative of the number of remaining taps.

7. The method of claim 5, further comprising:
    storing rewritable indications of filter coefficients associated with the taps.

8. A system comprising:
    a filter comprising:
        a processing chain having a selectable number of taps and progressively accumulating a sum along the taps the processing chain comprising a serial chain of processing units and each of the processing units having a different gain;
        a tap selection circuit coupled to the processing chain to selectively establish the number of taps of the chain, the tap selection circuit comprising a multiplexer to select one of the taps as the beginning tap in the chain and set an accumulated sum at the selected tap to zero; and
    a processor coupled to the filter.

9. The system of claim 8, wherein the multiplexer sets a delay at the selected tap to zero.

10. The system of claim 8, wherein the tap selection circuit comprises:
    a register storing bits indicative of the number of taps.

11. The system of claim 8, wherein the tapped delay line comprises:
    registers storing indications of filter coefficients associated with the taps.

12. The system of claim 8, wherein the processing circuit comprises a finite impulse response filter.

13. The system of claim 8, wherein the processing circuit comprises an infinite impulse response filter.

14. The system of claim 8, wherein the filter filters out noise.

15. The system of claim 8, wherein the filter reduces intersymbol interference.

16. The system of claim 8, wherein the filter reduces aliasing effects.

17. The system of claim 8, wherein the processor comprises a digital signal processor.

* * * * *